(12) United States Patent
Winterer et al.

(10) Patent No.: US 6,313,514 B1
(45) Date of Patent: Nov. 6, 2001

(54) PRESSURE SENSOR COMPONENT

(75) Inventors: Jürgen Winterer, Nürnberg; Eric Bootz, Kehlheim; Bernd Stadler, Donaustauf; Achim Neu, Regensburg; Thies Janczek, Regensburg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/093,336

(22) Filed: Jun. 8, 1998

(30) Foreign Application Priority Data

Jun. 6, 1997 (DE) .............................. 197 24 025

(51) Int. Cl.$^7$ .................................................. H01L 29/82
(52) U.S. Cl. .................... 257/417; 257/418; 257/419; 257/420; 257/788; 438/50; 438/51; 438/53; 73/721; 73/727
(58) Field of Search .................... 257/417, 418, 257/419, 420, 788; 438/50, 51, 53; 73/727, 721

(56) References Cited

U.S. PATENT DOCUMENTS

| 4,823,605 | | 4/1989 | Stein ........................................ 73/727 |
| 5,207,102 | * | 5/1993 | Takahashi et al. ...................... 73/727 |
| 5,444,286 | * | 8/1995 | Ichihashi .............................. 257/420 |
| 5,459,351 | * | 10/1995 | Bender .................................. 257/417 |
| 5,811,321 | * | 9/1998 | Yamaguchi ............................. 438/51 |
| 5,907,190 | * | 5/1999 | Ishikawa et al. ...................... 257/795 |

FOREIGN PATENT DOCUMENTS

| 40 06 450 A1 | 9/1991 | (DE) . |
| 42 03 832 A1 | 8/1992 | (DE) . |
| 42 19 575 A1 | 7/1993 | (DE) . |

OTHER PUBLICATIONS

Japanese Patent Abstract No. 04352435 (Tetsuya), dated Dec. 7, 1992.

David J. Beebe et al.: "A silicon force sensor for robotics and medicine", Sensors and Actuators A 50 (1995) pp. 55–65, Elsevier, Amsterdam.

* cited by examiner

*Primary Examiner*—William Mintel
(74) *Attorney, Agent, or Firm*—Herbert L. Lerner; Laurence A. Greenberg; Werner H. Stemer

(57) ABSTRACT

The pressure sensor component has a chip carrier carrying a semiconductor chip with an integrated pressure sensor having a pressure-detecting surface exposed to the pressure to be measured. A device encapsulation made from an electrically insulating material surrounds the entire assembly except for protruding electrode terminals. Bond wires connect the electrode terminals with the pressure sensor and/or the electronic circuit of the semiconductor chip. The device encapsulation consists entirely of a homogeneous pressure-transmitting medium comprising an enveloping compound, which transmits the pressure to be measured as free from delay and attenuation as possible but is mechanically resistant and dimensionally stable. The pressure to be measured is transmitted directly by the enveloping compound onto the pressure-detecting surface of the semiconductor chip, and the pressure sensor and/or the pressure sensor component is covered tightly on all sides against mechanical and/or chemical influences.

10 Claims, 1 Drawing Sheet

PRESSURE SENSOR COMPONENT

BACKGROUND OF THE INVENTION

Field of the Invention

The invention relates to a pressure sensor component having a semiconductor chip with an integrated pressure sensor carried on a chip carrier. A pressure-detecting surface is subjected to the pressure to be measured. The assembly is encapsulated in a device encapsulation made from an electrically insulating material and surrounding at least partially the semiconductor chip and/or the chip carrier as well as the bond wires which connected outwardly guided electrode terminals and the pressure sensor and/or the electronic circuit of the semiconductor chip. The chip carrier has electrode terminals electrically connected to the pressure sensor and/or an electronic circuit, assigned to the pressure sensor, of the semiconductor chip. The electrode terminals penetrate the device encapsulation. At least that portion of the device encapsulation which is adjacent the pressure-detecting surface of the pressure sensor is formed by a homogeneous pressure-transmitting medium comprising an enveloping compound, which transmits the pressure to be measured substantially without delay and attenuation but is mechanically resistant. The material is substantially dimensionally stable, at least after curing, as appropriate. The pressure to be measured is guided directly by the enveloping compound onto the pressure-detecting surface of the semiconductor chip, and the pressure sensor and/or the pressure sensor component is covered tightly on all sides against mechanical and/or chemical influences. The method further pertains to a method of producing such a pressure sensor component.

Pressures are measured by bringing the medium to be measured up to the sensor, or by transmitting the pressure prevailing in the medium to the sensor. On the other hand, the application of a semiconductor pressure sensor in the final use requires that the sensor chip is provided with a protective encapsulation by being covered with a suitable material, normally plastic. The covering or encapsulation of the sensor chip requires several process steps wherein the device is given its final form and an electric connecting cable is encapsulated by injection molding after soldering to the printed circuit board.

The semiconductor chip, usually a silicon base material chip, is generally provided in a rigid housing, for example DIP housing (dual inline package housing), SMD housing (surface mounted design housing), or in special designs. The housing is subsequently fitted on a printed circuit board. In one prior art system, the pressure is coupled in via a diaphragm which covers, and thus protects, the sensitive sensor. The diaphragm consists of metal or plastic and also can be designed as a separate additional assembly. Problems frequently arise in this case because pressure is only insufficiently coupled in through the housing up to the sensor chip with the sensor being simultaneously protected. Generally, what is required is a tight connection between the medium to be measured and the sensor which is easy to produce in order to avoid extraneous air which falsifies the pressure measurement from flowing in. On the other hand, in many cases there is, moreover, a requirement to separate the medium to be measured from the metal constituents of the sensor and from the semiconductor chip, in order to avoid the risk of corrosion or destructive influence by the medium on the sensitive constituents of the sensor. Other designs of known pressure sensor components provide an open housing in which the protection of the sensor chip against environmental influences is regarded only as a problem of secondary importance and the sensor chip is not protected. Such designs are generally not suitable for non-aggressive media.

A pressure sensor component as it is described above is disclosed German published, non-prosecuted application DE 42 38 113 A1. There, the semiconductor chip is surrounded on all sides by an elastic material (silicone rubber) which simultaneously serves to fasten and cover the chip. The configuration, comprising semiconductor chip and silicone rubber covering, is encapsulated in a conventional housing made from plastic material.

A conventional type of semiconductor pressure pick-up is disclosed in German published, non-prosecuted application DE 42 03 832 A1.

A pressure sensor component with a relatively thick diaphragm structure is disclosed by David J. Beebe et al. in *Sensors and Actuators*, Vol. A 50, 1995, p. 55–65. The applied pressure force is directed to the diaphragm via a dome-like solid body structure.

Finally, the use of polyimide resin compounds to encapsulate semiconductor components has been disclosed in German published, non-prosecuted application DE 40 06 450 A1.

It is common to all of the prior art designs of semiconductor pressure sensors that their manufacture requires a multistage process for covering or encapsulating the device and for forming the component into its desired component structure.

SUMMARY OF THE INVENTION

It is accordingly an object of the invention to provide a pressure sensor component and a method for producing such a component, which overcomes the above-mentioned disadvantages of the prior art devices and methods of this general type and in which the encapsulation of the semiconductor chip carrying the mechanically sensitive pressure sensor, and/or of the chip carrier, can be peformed more simply in structural terms and thus also more cost-effectively. Furthermore, a proper connection should be assured between the medium to be measured and the pressure sensor which is comparatively simple to set up but nevertheless adequately tight.

With the foregoing and other objects in view there is provided, in accordance with the invention, a pressure sensor component, comprising:

a chip carrier;

a semiconductor chip disposed on the chip carrier, the semiconductor chip including an integrated pressure sensor with a pressure-detecting surface exposed to a pressure to be measured;

a device encapsulation of electrically insulating material at least partially surrounding one of the semiconductor chip and the chip carrier;

the chip carrier having electrode terminals penetrating the device encapsulation outwardly;

bond wires electrically connected between the electrode terminals and the semiconductor chip;

the device encapsulation being formed of a homogeneous pressure-transmitting medium comprising an enveloping compound transmitting the pressure to be measured substantially without delay and attenuation and being mechanically resistant and essentially dimensionally stable, such that the pressure to be measured is guided directly by the enveloping compound onto the pressure-detecting surface on the semiconductor chip and the pressure sensor is covered tightly on all sides against at least one of mechanical and chemical influences.

With the above objects in view there is also provided, in accordance with the invention, a method of producing a pressure sensor component, which comprises:

providing a chip carrier, mounting a semiconductor chip with an integrated pressure sensor on the chip carrier, and electrically connecting bond wires between the semiconductor chip and outward electrode terminals of the pressure sensor component;

inserting the chip carrier with the semiconductor chip into an injection mold cavity and molding with liquid silicone rubber for encapsulating the pressure sensor component with a device encapsulation covering a pressure-detecting surface of the pressure sensor; and subsequently curing the silicone rubber at comparatively low pressure and in conjunction with a heat treatment and forming the device encapsulation as a homogeneous pressure-transmitting medium which transmits a pressure to be measured substantially without delay and attenuation yet which is mechanically resistant and dimensionally stable, such that the pressure to be measured is transmitted directly by the device encapsulation onto the pressure-detecting surface of the semiconductor chip.

In other words, the invention is characterized by that the entire device encapsulation consists of the enveloping compound. After mounting and bonding the semiconductor chip on the chip carrier, the device encapsulation is formed to envelope the semiconductor chip and/or chip carrier. The semiconductor chip and the pressure sensor are covered tightly on all sides against mechanical and/or chemical influences. A particularly simple and thus cost-effective production by reducing the process steps and economizing on material used arises when, according to the invention, the entire device encapsulation consists of the enveloping compound. The sensor is protected against environmental influences by the enveloping compound completely enveloping the pressure sensor component, the pressures to be measured being transmitted free from loss and delay. At the same time, both the overall size and the weight of the device can be advantageously minimized.

It is a particularly preferred feature for the pressure sensor component to be encapsulated by means of an LSR (Liquid Silicon Rubber) process. The components of the device, which are inserted in a cavity of an injection mold, are thereby encapsulated by injection molding with a liquid silicone rubber, and thereupon the silicone rubber is cured at comparatively low pressure and in conjunction with a heat treatment.

There are no limits per se set on the external dimensions and appearance of the device encapsulation, which consists of the enveloping compound. By changing the shape of the housing or adapting the injection mold used in encapsulating the device, the sensor can be designed for different applications while having the same function. Lock-in or snap-on connections such as are used in the automobile industry are, for example, conceivable.

In accordance with an added feature of the invention, the enveloping compound comprises a material selected from the group consisting of rubber and rubber-like material.

In accordance with an additional feature of the invention, the enveloping compound comprises silicone rubber material which, preferably, is thermally cross-linkable.

During the propagation of the pressure waves, the latter experience in the enveloping compound time delays, on the one hand, and losses on the other hand. A decrease in the intensity of the pressure waves is observed, which is designated as dissipation by analogy with the propagation of sound and is to be distinguished from sound absorption at sound-absorbing wall surfaces. An exponential decrease is observed in the intensity of the pressure waves with increasing distance, with a proportionality factor as dissipation constant which is a function of the material of the enveloping compound. The dissipation of the pressure waves could well have different causes; losses due to thermal conduction are likely to be most important.

In accordance with another feature of the invention, the pressure-transmitting material has a layer thickness above the pressure-detecting surface of no more than 300 $\mu$m, and particularly a thickness in a range from 100 $\mu$m to 200 $\mu$m.

Transmitting the pressure to be measured to the pressure sensor in a way which is substantially free from loss and delay comes about when the layer thickness, effective for pressure transmission, of the pressure-transmitting medium above the pressure-detecting surface is no more than approximately 300 $\mu$m. The targeted use of a very thin layer of approximately 100 $\mu$m thus ensures minimum pressure delay or pressure attenuation, as well as sensitivity to accelerations and feedback, associated therewith, on the pressure measurements of the sensor chip. At the same time, the chip is still adequately protected against chemical environmental influences, and mechanical protection is ensured to a certain degree, depending on the desired design.

In accordance with a further feature of the invention, the electrode terminals are configured to allow surface-mounting of the pressure sensor component.

In accordance with again an added feature of the invention, bond wires of low loop-forming ability are connected between the electrode terminals and the pressure sensor and/or an electronic circuit assigned to the pressure sensor on the semiconductor chip.

Other features which are considered as characteristic for the invention are set forth in the appended claims.

Although the invention is illustrated and described herein as embodied in a pressure sensor component and method for producing the component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
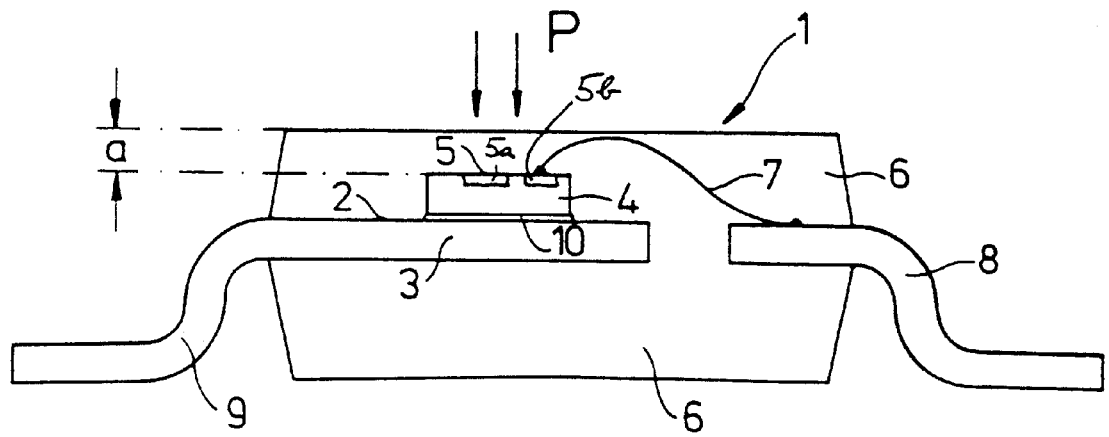
FIG. 1 is a diagrammatic sectional view through a pressure sensor component adapted to be surface mounted, in which the pressure sensor housing consists entirely of a flexible enveloping compound.

Referring now to the figures of the drawing in detail and first, particularly, to FIG. 1 thereof, there is seen a pressure sensor component 1 for surface mounting on the insertion surface of a printed circuit board. The pressure sensor component 1 has a chip carrier 3 with an approximately plane chip carrier surface 2. The chip carrier 3 is made from an electrically conductive material. A silicon-based semiconductor chip 4 is fastened on the chip carrier surface 2. The chip 4 includes an integrated pressure sensor 5a and an electronic circuit 5b assigned to the sensor. A pressure-detecting surface 5, which is exposed to the pressure P to be measured, is indicated at the top of the chip.

The pressure sensor component 1 is protected against external environmental influences by means of a device encapsulation 6 which surrounds the semiconductor chip 4 and/or the chip carrier 3, at least partially. The encapsulation is made from an electrically insulating material. The chip carrier 3 is designed as a conventional lead frame, that is to say as a prefabricated chip carrier substrate with a multiplicity of electrode terminals 8, 9 which penetrate the device encapsulation 6 and are connected electrically by means of bond wires 7 to the pressure sensor 5a and to the electronic circuit 5b. In FIG. 1 only two electrode terminals are represented, the electrode terminal 9 being electrically coupled directly to the underside of the semiconductor chip 4 via back bonding 10. The terminals are designed in the form of pins which are guided out to at least two sides of the chip carrier 3 and are bent and cut in a conventional manner to form short wing-shaped connecting stubs. Such an arrangement ensures mounting of the device 1 on the mounting or insertion surface of a printed circuit board by means of SMD technology.

Use is made in the exemplary embodiment, for the purpose of electrically connecting the pressure sensor (integrated on the semiconductor chip 4) or the electronic circuit assigned to the pressure sensor to the electrode terminals 8, 9, of a wire bonding method in which bond wires 7 are fastened to the chip 4 and drawn on to the electrode pin to be connected accordingly. It will be appreciated by those skilled in the art that it is also possible to find for the electric connection a so-called spider bonding in which instead of bond wires use is made of an electrically conducting lead frame plate on which the chip 4 is directly bonded.

The pressure sensor integrated on the silicon semiconductor chip 4 is a so-called piezoelectrically resistive sensor. Provision is made of a thin silicon diaphragm which is fabricated in the surface of the chip 4 using micromechanical methods and is coupled electrically to pressure-dependent resistors which are likewise constructed in the silicon substrate and connected in a bridge circuit, in a manner known per se. Likewise integrated in the semiconductor chip 4 is a circuit assigned to the sensor which is used for signal conditioning (amplification and attenuation), but also for calibrating and compensating for the sensor. By contrast with other designs, such semiconductor pressure sensors on which the invention is based are suitable principally for applications in which the smallest possible overall size is important. This is the case, for example, in the context of pressure measurements in the automotive sector, for example when measuring braking pressures, tire pressures, combustion chamber pressures and the like. In addition to semiconductor pressure sensors which operate according to the principle of piezoelectrically resistive pressure measurement, it is also possible to use sensors which operate according to capacitive measurement principles.

According to the invention, the entire device encapsulation 6 consists of an enveloping compound, forming a homogeneous pressure-transmitting medium, which transmits the pressure P to be measured as free as possible from delay and attenuation. The compound is mechanically resistant, and, possibly after a curing process, is essentially dimensionally stable. The enveloping compound 6 preferably has a silicone rubber material which is present initially in a liquid or flowable phase and which is thermally crosslinked after shaping by heat treatment. Thereafter, it remains essentially dimensionally stable. The layer thickness a, effective for pressure transmission, of the pressure-transmitting medium above the pressure-detecting surface 5 is selected such that the pressure to be measured can be transmitted as far as possible without delay and attenuation, and, at the same time, the bond wires 7 of low loop height fabricated by means of low loop bonding are still completely embedded inside the encapsulating material 6. A layer thickness a of approximately 100 μm effects an only slight pressure delay and/or attenuation, and ensures still adequate mechanical protection to some degree. In any case, the layer thickness a is below approximately 300 μm.

Figure 2:
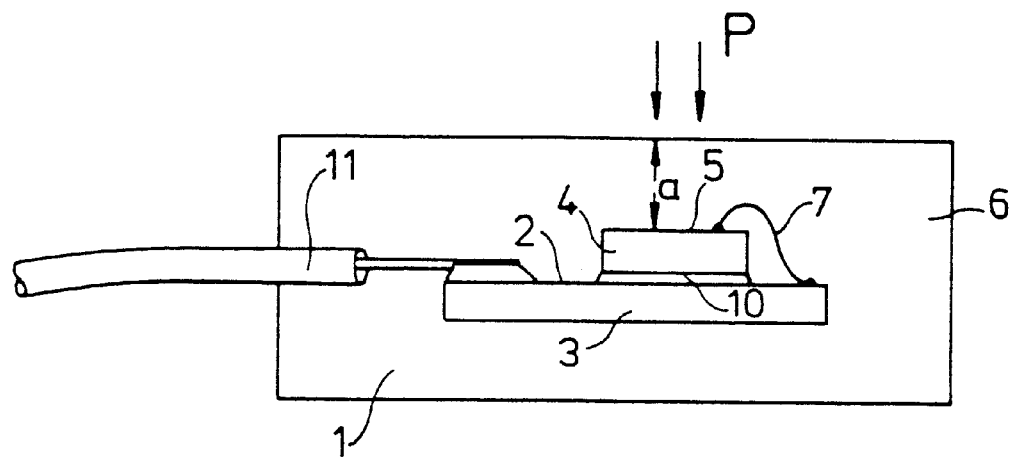
FIG. 2 is a sectional view of a pressure sensor component having an encapsulation consisting of a flexible enveloping compound, in which the electrical connection is effected by a single-core or multi-core cable which penetrates the enveloping compound.

FIG. 2 shows a further exemplary embodiment of the invention, in which the pressure sensor component 1 is likewise completely integrated as an encapsulation inside a flexible enveloping compound 6. Here, the chip carrier 3 is present as a relatively small piece of a carrier or of a metal lead frame island on which the semiconductor chip 4 is placed. Once again, bonding is served by bond wires 7 bonded in low loop technology, as well as optionally by back bondings 10 on the underside of the chip 4. Soldered to the carrier 3 is a single-core or multi-core cable 11 which comes to lie only to a slight extent inside the flexible enveloping compound 6. For the purpose of transmitting pressure as optimally as possible, the layer thickness a is again a few 100 μm, preferably no more than approximately 300 μm.

We claim:

1. A pressure sensor component, comprising:
   a chip carrier;
   a semiconductor chip disposed on said chip carrier, said semiconductor chip including an integrated pressure sensor with a pressure-detecting surface exposed to a pressure to be measured;
   a device encapsulation of electrically insulating material surrounding said semiconductor chip and surrounding at least a portion of said chip carrier;
   said chip carrier having electrode terminals penetrating said device encapsulation outwardly;
   bond wires electrically connected between said electrode terminals and said semiconductor chip;
   said device encapsulation being formed of a homogeneous pressure-transmitting medium comprising an enveloping compound transmitting the pressure to be measured.

2. The pressure sensor component according to claim 1, wherein said enveloping compound comprises a material selected from the group consisting of rubber and rubber-like material.

3. The pressure sensor component according to claim 1, wherein said enveloping compound comprises silicone rubber material.

4. The pressure sensor component according to claim 3, wherein said silicone rubber material is thermally crosslinkable.

5. The pressure sensor component according to claim 1, wherein said pressure-transmitting material has a layer thickness above said pressure-detecting surface of no more than 300 µm.

6. The pressure sensor component according to claim 1, wherein said pressure-transmitting material has a layer thickness above said pressure-detecting surface of substantially between 100 µm and 200 µm.

7. The pressure sensor component according to claim 1, wherein said electrode terminals are configured to allow surface-mounting of the pressure sensor component.

8. The pressure sensor component according to claim 1, which further comprises bond wires of inhibited loop-forming ability connected between said electrode terminals and said pressure sensor.

9. The pressure sensor component according to claim 1, which further comprises an electronic circuit integrated on said semiconductor chip and connected to said pressure sensor.

10. The pressure sensor component according to claim 9, which further comprises bond wires of inhibited loop-forming ability connected between said electrode terminals and said electronic circuit.

* * * * *